(12) United States Patent
Omura

(10) Patent No.: US 11,398,587 B2
(45) Date of Patent: Jul. 26, 2022

(54) METHOD OF MANUFACTURING LIGHT-TRANSMISSIVE SHEET

(71) Applicant: NICHIA CORPORATION, Anan (JP)

(72) Inventor: Reiko Omura, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 175 days.

(21) Appl. No.: 16/138,404

(22) Filed: Sep. 21, 2018

(65) Prior Publication Data
US 2019/0103528 A1 Apr. 4, 2019

(30) Foreign Application Priority Data
Sep. 29, 2017 (JP) .............................. JP2017-191851

(51) Int. Cl.
| | |
|---|---|
| *B32B 27/38* | (2006.01) |
| *H01L 33/50* | (2010.01) |
| *H01L 33/56* | (2010.01) |
| *B32B 27/18* | (2006.01) |
| *H01L 33/00* | (2010.01) |
| *H01L 33/40* | (2010.01) |
| *H01L 33/26* | (2010.01) |

(52) U.S. Cl.
CPC .............. *H01L 33/56* (2013.01); *B32B 27/18* (2013.01); *B32B 27/38* (2013.01); *H01L 33/0095* (2013.01); *H01L 33/40* (2013.01); *H01L 33/50* (2013.01); *H01L 33/505* (2013.01); *H01L 33/26* (2013.01); *H01L 2933/005* (2013.01); *H01L 2933/0041* (2013.01)

(58) Field of Classification Search
CPC ..... H01L 33/56; H01L 33/50; H01L 33/0095; H01L 33/40; H01L 33/505; B32B 27/18; B32B 27/38
See application file for complete search history.

(56) References Cited

U.S. PATENT DOCUMENTS

| | | | | |
|---|---|---|---|---|
| 3,876,607 | A | * 4/1975 | Snell | ................. C08G 59/4021 523/445 |
| 2004/0178492 | A1 | * 9/2004 | Tsukamoto | ....... H01L 23/49827 257/690 |
| 2013/0180767 | A1 | * 7/2013 | Tateishi | ................... H05K 3/46 174/255 |
| 2014/0131752 | A1 | 5/2014 | Kondo et al. | |
| 2015/0179482 | A1 | * 6/2015 | Mitani | .................... H01L 33/54 438/118 |
| 2016/0093781 | A1 | 3/2016 | Tamaki et al. | |
| 2016/0190400 | A1 | * 6/2016 | Jung | .................. H01L 33/0095 362/97.1 |

(Continued)

FOREIGN PATENT DOCUMENTS

| | | |
|---|---|---|
| JP | 2012-224787 A | 11/2012 |
| JP | 2013-159003 A | 8/2013 |

(Continued)

*Primary Examiner* — Mathieu D Vargot
(74) *Attorney, Agent, or Firm* — Global IP Counselors, LLP

(57) ABSTRACT

A method of manufacturing a light-transmissive sheet includes: preparing a first support with a first resin in a B-stage being placed on a surface of the first support; preparing a second support; and heating the first resin to convert the first resin from the B-stage to a C-stage, in a state in which the second support is placed on a surface of the first resin.

18 Claims, 15 Drawing Sheets

(56) References Cited

U.S. PATENT DOCUMENTS

2018/0242448 A1* 8/2018 Yoshikawa ........... C08L 53/005
2018/0309034 A1* 10/2018 Ooyabu .................. H01L 33/46

FOREIGN PATENT DOCUMENTS

| | | |
|---|---|---|
| JP | 2014-096491 A | 5/2014 |
| JP | 2015-008266 A | 1/2015 |
| JP | 2015-195396 A | 11/2015 |
| JP | 2016-072471 A | 5/2016 |
| JP | 2016-215532 A | 12/2016 |
| WO | 2016148019 A1 | 9/2016 |
| WO | 2017094832 A1 | 6/2017 |

* cited by examiner

METHOD OF MANUFACTURING LIGHT-TRANSMISSIVE SHEET

CROSS-REFERENCE TO RELATED APPLICATIONS

This application claims priority to Japanese Patent Application No. 2017-191851 filed on Sep. 29, 2017. The entire disclosure of Japanese Patent Application No. 2017-191851 is hereby incorporated herein by reference.

TECHNICAL FIELD

The present disclosure relates to a method of manufacturing a light-transmissive sheet.

BACKGROUND ART

Light emitting devices that are provided with a light-transmissive sheet containing a phosphor and a light emitting element are known. For example, the light-transmissive sheet is placed on the light emitting element to form such a light emitting device. With the phosphor evenly distributed in the light-transmissive sheet, for example, compared to when forming a light-transmissive member by potting a light-transmissive member in a liquid form that contains phosphor, it is possible to obtain a light emitting device in which variation of chromaticity, luminous flux, and light distribution are reduced.

As a method of manufacturing the light-transmissive sheet, a method has been proposed in which a sheet before cross-linking that contains polyorganosiloxane and phosphor is irradiated with radiation to crosslink the polyorganosiloxane, which allows for performing crosslinking without generating irregularities on the support and light-transmissive sheet (in Japanese Laid-Open Patent Application Publication No. 2015-8266, for example).

SUMMARY

However, because radiation is used in such a method, for such a method, large-sized equipment is used due to safety measures, and construction of the surrounding environment is required, so that manufacturing costs for the light-transmissive sheet may be increased.

Accordingly, a purpose of the present invention is to provide a manufacturing method with which is it possible to easily obtain a light-transmissive sheet with few recesses and projections on the surface.

A method of manufacturing a light-transmissive sheet according to one embodiment includes: preparing a first support part having a first resin member in a B-stage placed on a surface of the first support part; preparing a second support part; and heating the first resin member to convert the first resin member from the B-stage to a C-stage, in a state in which the second support part is placed on a surface of the first resin member.

According to the above, it is possible to easily obtain a light-transmissive sheet with few recesses and projections on the surface.

DETAILED DESCRIPTION OF EMBODIMENTS

Figure 1:
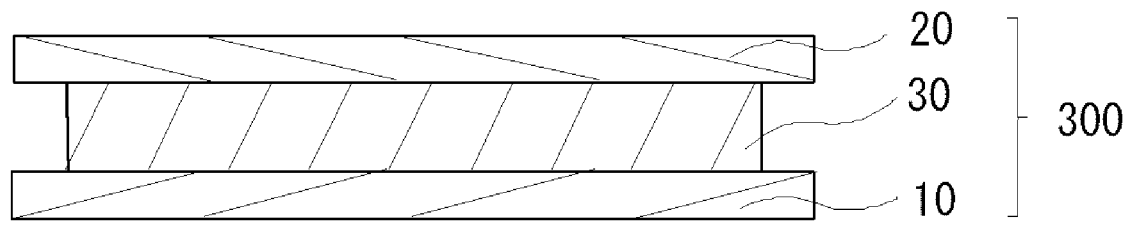
FIG. 1 is a schematic cross-sectional view of a light-transmissive sheet of Embodiment 1.

Certain embodiments of the present invention are described below while referring to drawings as appropriate. The light-transmissive sheet described hereafter is intended for giving a concrete form to the technical idea of the present invention, and unless specifically noted, the present invention is not limited to the description below. Also, the sizes and positional relationships, etc., of the members shown in the drawings may be exaggerated to clarify the explanation.

In this specification, expressions indicating the cured state of a resin according to the Japanese Industrial Standards (JIS) K 6800 are used.

An expression "A-stage" refers to an initial state of a thermosetting resin generation reaction. The resin in this state is still soluble in certain types of solvents, and melts when heated.

An expression "B-stage" refers to an intermediate state of curing of a thermosetting resin. The resin in this state is softened when heated, and swells when brought into contact with certain types of solvents, but is not completely melted or dissolved.

An expression "C-stage" refers to the final state of the curing reaction of a thermosetting resin. The resin in this state is insoluble and infusible, and the thermosetting resin in a completely cured adhesive layer is in this state.

Further, as for a first resin, a second resin, a first resin layer, and a second resin layer, for example, a first resin in the A-stage may be referred to as a "first resin A", etc., in accordance with the cured state. When not considering the cured state, the first and second resins are simply referred to as "first resin" and "second resin".

Also, a laminated structure including the first support, the first resin and/or the second resin that has been converted to the C-stage, and the second support is used as the light-transmissive-sheet.

Embodiment 1

FIG. 1 is a schematic cross-sectional view showing an example of the light-transmissive sheet of Embodiment 1. FIG. 2A to 2F are schematic cross-sectional process diagrams showing the method of manufacturing the light-transmissive sheet of Embodiment 1.

The light-transmissive sheet of Embodiment 1 includes a first support 10 (a first support part), a second support 20 (a second support art), and a first resin 30 (a first resin member).

The manufacturing method of Embodiment 1 includes:
(1) preparing a first support for which a B-stage first resin is placed on a top surface,
(2) preparing a second support, and
(3) heating with the second support in a state in which the second support is laminated on the top surface of the B-stage first resin to form the light-transmissive sheet with the first resin in the C-stage.

According to the method of manufacturing a light-transmissive sheet, as described above, it is possible to easily manufacture the light-transmissive sheet in which generation of irregularities in the first resin surface is reduced.

In the description below, a detailed explanation is given of the constitutional members and each step of the invention of this application.

1. Preparing the First Support 1-1. Preparing the First Support

Figure 2A:
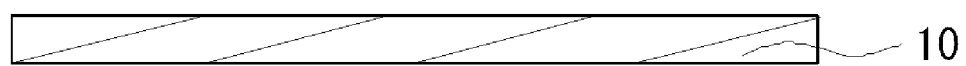
FIG. 2A is a schematic cross-sectional process diagram showing the method of manufacturing the light-transmissive sheet of Embodiment 1.

As shown in FIG. 2A, the first support 10 is prepared. The first support 10 can be of any appropriate shape, but is preferably a flat-plate or sheet shape. Also, it is preferable to have a flat surface on which can be coated by a first resin 30, which will be described below, can be applied.

1-2. Placing First Resin in A-Stage on Top Surface of First Support

Figure 2B:
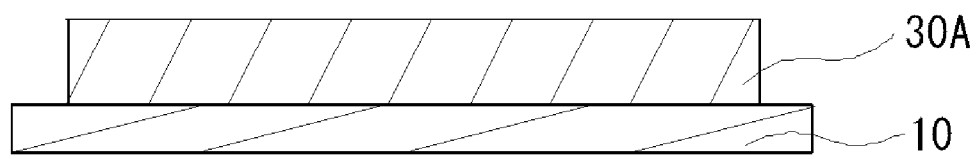
FIG. 2B is a schematic cross-sectional process diagram showing the method of manufacturing the light-transmissive sheet of Embodiment 1.

Next, as shown in FIG. 2B, the A-stage first resin 30 (hereafter referred to as "first resin 30A") is placed on the top surface of the first support 10.

As a method for placing the first resin 30A on the top surface of the first support 10, it is possible to employ comma coater coating, knife coater coating, die coater coating, kiss coater coating, gravure coater coating, roller coater coating, lithographic printing, plateless printing, air spray, airless spray, injection molding, extrusion molding, compression molding, etc. Among these methods, in view of mass producibility and uniformity in thickness of light-transmissive sheet, comma coater coating, knife coater coatings and die coater coating are preferable.

After the first resin 30A is placed on the top surface of the first support 10, for the purpose of protecting a surface of the first resin 30A, it is also possible to cover surfaces of the first resin 30A with a cover film. As a result, it is possible to prevent the formation of irregularities in the surface of the first resin 30A due to contact during the manufacturing steps or during storing, etc., and also to reduce adherence of foreign matter such as fiber waste, resin waste, sebum, etc.

The first resin 30A can be made of only a resin material, or alternatively, a resin material and an organic solvent added thereto may also be used. Adding an organic solvent to a resin material allows for adjusting the viscosity and thixotropy of the resin material, so that the thickness of the first resin 30A can be easily made uniform. Also, when the first resin 30A contains a phosphor, a filler, etc., adding the organic solvent to the first resin 30A allows for improving uniformity of concentration of the phosphor and the filler.

The thickness of the first resin 30A can be selected as appropriate according to the purpose of use. For example, the first resin 30A preferably has a thickness of approximately 0.1 µm to 1000 µm, and more preferable to 10 µm to 200 µm. For example, when the first resin 30A contains a phosphor, variation in thickness of the first resin 30A may cause variation in emission color of the light emitting device manufactured using the light-transmissive sheet. In view of this, it is preferable that the first resin 30A have substantially uniform thickness, and that variation in thickness of the first resin 30A be preferably less than 10%, and more preferably less than 5%.

1-3. Converting A-Stage First Resin to B-Stage

Figure 2C:
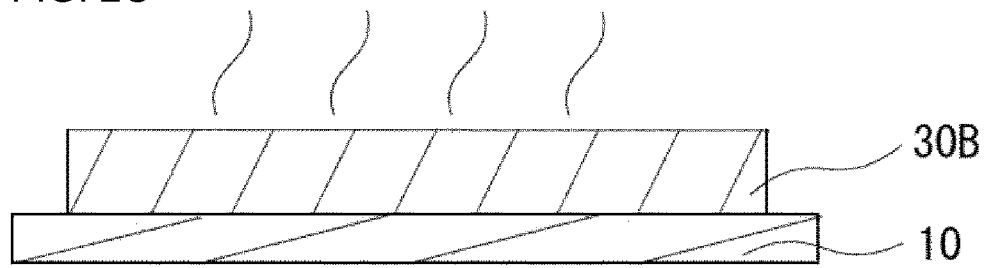
FIG. 2C is a schematic cross-sectional process diagram showing the method of manufacturing the light-transmissive sheet of Embodiment 1.

As shown in FIG. 2C, the first resin 30A placed on the top surface of the first support 10 is heated to be a B-stage first resin 30 (hereafter referred to as "first resin 30B"). Examples of a method for converting to the B-stage include a method using heating, a method of irradiating UV light, a method of using a room temperature curing resin and leaving the room temperature curing resin at room temperature, etc., and in view of stability and controllability of the conversion to the B-stage, the method using heating is the most preferable. For heating, it is possible to use an oven, a hot plate, etc., and in view of uniformity in temperature, an oven is most suitable.

Also, when curing the first resin 30A, it is preferable that the first support 10 and the first resin 30A have substantially flat surfaces, and curing is performed in a state where a surface of the first support 10 opposite from the first resin 30A is supported on the top surface of a flat plate, which is held substantially horizontally.

This reduces flowing of the first resin 30A when its viscosity is decreased due to heating, and allows the first resin 30B after curing to have a uniform thickness. It is also possible to prevent adhesion of the first resin 30B with the heating device.

The top surface of the first resin 30A is preferably heated in a state where the first resin 30A is exposed to outside air. When the first resin 30A contains an organic solvent or low molecular component, during curing to be converted from the A-stage to the B-stage, an organic solvent, a low molecular component, etc. become volatilized from the resin. At that time, with the top surface of the first resin 30A covered by a film, etc., volatilization is inhibited, and voids or irregularities is easily generated in the first resin 30. Accordingly, with the first resin 30A exposed to outside air, it is possible to reduce occurrence of voids and irregularities. Conversion to B-stage can be performed at a temperature or time appropriate for a resin material to be used as appropriate. For example, the temperature at the conversion to the B-stage is preferably in a range of 80 to 150° C., and the time for the conversion to the B-stage is preferably in a range of 5 to 60 minutes. With these temperatures or times, the first resin 30A is not completely cured and can be in a B-stage where the first resin is softened when heated, so that the second support 20 described below can be easily laminated thereon.

2. Preparing the Second Support 20

Figure 2D:
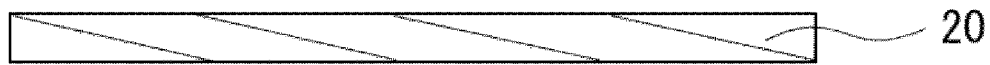
FIG. 2D is a schematic cross-sectional process diagram showing the method of manufacturing the light-transmissive sheet of Embodiment 1.

Next, as shown in FIG. 2D, the second support 20 is prepared. The second support 20 can be the same as or different from the first support 10 described above. For example, the second support 20 can be any appropriate shape, but is preferably a flat plate or sheet shape. It is also preferable for the second support 20 to have a flat planar surface.

3. Forming a C-Stage First Resin

3-1. Laminating the Second Support 20

Figure 2E:
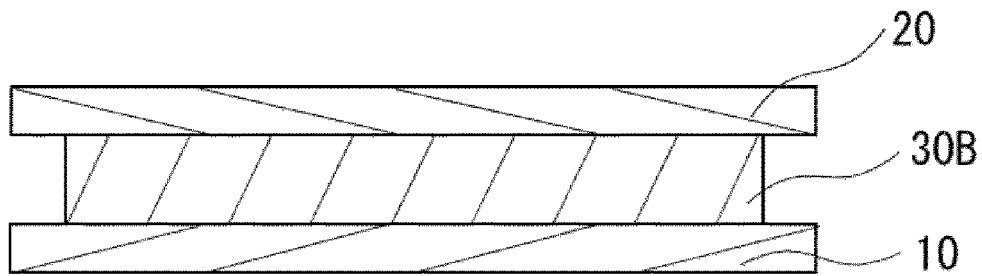
FIG. 2E is a schematic cross-sectional process diagram showing the method of manufacturing the light-transmissive sheet of Embodiment 1.

As shown in FIG. 2E, the second support 20 is laminated on the surface of the first resin 30B that is opposite side to the surface on which the first support 10 is placed. For lamination, for example, it is possible to use a vacuum laminator, a roller laminator, a thermocompression bonding device such as a hot press, etc. can be used. The vacuum laminator is preferably used. The vacuum laminator can perform lamination in a vacuum, and can apply pressure uniformly to the surface of the first resin 30B, and thus is preferable. As a result, it is possible to laminate the second support 20 while suppressing the occurrence of voids, or irregularities.

For the temperature during lamination, a temperature appropriate for the used first resin 30B can be selected as appropriate. For example, the temperature when laminating using thermocompression bonding can be 10 to 100° C., especially preferably 30 to 80° C. Also, the pressure applied during lamination can be 0.1 MPa to 1 MPa, for example, and the time for maintaining the pressure is preferably 10 to 1000 seconds. With these ranges, the first resin 30B is stably adhered to the second support 20.

3-2. Converting First Resin 30B to C-stage

Figure 2F:
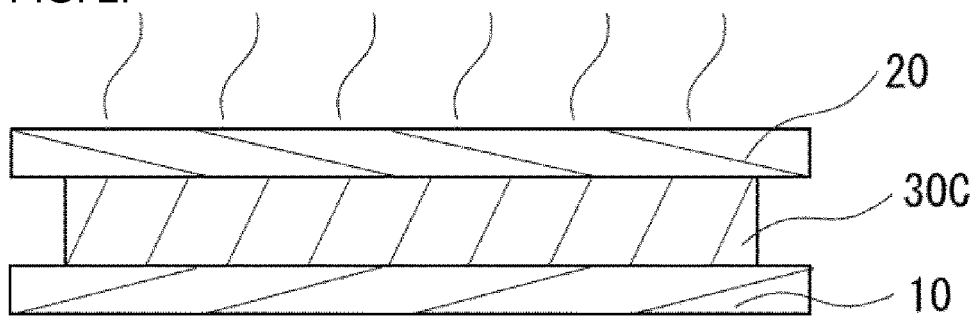
FIG. 2F is a schematic cross-sectional process diagram showing the method of manufacturing the light-transmissive sheet of Embodiment 1.

As shown in FIG. 2F, the first resin 30B is converted to the C-stage (hereafter referred to as "first resin 30C") in a state where the first support 10, the first resin 30B, and the second support 20 are laminated. More specifically, the conversion to the C-stage is performed in a state where opposite surfaces of the first resin 30B, for example the top surface and the bottom surface of the first resin 30B, are respectively covered by the first support and the second support. This allows for preventing occurrence of irregularities in the surface of the first resin 30C, and allows for obtaining a light-transmissive sheet (i.e., first resin 30C) with a smooth surface. Also, it is possible to prevent adhesion of foreign matter during processing to convert to the C-stage, and possible to easily obtain a light-transmissive sheet that is stable in terms of quality.

An oven, a hot plate, etc., can be used for a processing to convert to the C-stage, and an oven is suitable in view of heat uniformity. A heating profile, it is possible to select as appropriate the conditions suitable for respective resins can be selected as a heating profile. For example, at 20° C. to 60° C., the temperature starts to rise after the light-transmissive sheet is placed in the oven, and after being maintained for 1 to 8 hours at 80° C. to 200° C., cooling is performed, and it is preferable to remove at 20° C. to 60° C. Rapid heating may cause problems with temperature uniformity, which may cause warping of the light-transmissive sheet and irregularities or voids. On the other hand, with ah excessively slow heating, degradation of the resin due to excess heating may occur. By heating under the conditions described above, it is possible to obtain the desired first resin 30 without the occurrence of these problems.

Materials and the like used for constituent members of the light-transmissive sheet of Embodiment 1 are described below.

First Resin 30

The first resin 30 is transmissive of light emitted from the tight emitting element when used as the light emitting device. "Light-transmissive" refers to that the light transmittance with respect to peak emission wavelength of light emitted from the light emitting element is preferably 60% or greater, more preferably 70% or greater, and even more preferably 80% or greater.

For the first resin 30, a silicone based resin, an epoxy based resin, a phenol based resin, a polycarbonate based resin, an acrylic based resin, or a modified resin of these can be used. Among these, a silicone based resin, specifically, a silicone resin or a modified resin thereof, has good heat resistance and light resistance, and thus is preferable. Specific examples thereof include dimethyl silicone resin, phenylmethyl silicone resin, and diphenyl silicone resin. A single layer of one of these materials or a multilayer of two or more of these materials can be used for the first resin 30.

It is also possible for the first resin 30 to contain phosphor and/or a filler.

Phosphor

The phosphor converts light from the light emitting element into a light with a different wavelength, and can convert light to a shorter wavelength than the light from the light emitting element, or alternatively, in view of light extraction efficiency, it is preferable to convert light from the light emitting element into a light with a longer wavelength.

For the phosphor, a phosphor known in this field can be used. Examples thereof include cerium-activated yttrium-aluminum-garnet (YAG) based phosphor, cerium-activated lutetium-aluminum-garnet (LAG) based phosphor, europium and/or chromium-activated nitrogen-containing calcium aluminosilicate ($CaO-Al_2O_3-SiO_2$) based phosphor, europium-activated silicate (($Sr, Ba)_2SiO_4$) based phosphor, β sialon phosphor, nitride-based phosphor such as CASN based or SCASN based phosphor, KSF based phosphor ($K_2SoF_6$: Mn), sulfide based phosphor, etc. With these phosphors, it is possible to obtain a light emitting device that emits mixed color light of a primary light of a wavelength of visible light and a secondary light (white-based color light, for example), or a light emitting device that is excited by ultraviolet light primary light and emits secondary light or a wavelength of visible light. When the light emitting device is used as a backlight of a liquid crystal display, etc., it is preferable to use a phosphor that is excited by blue light and emits red light (e.g. KSF based phosphor), and a phosphor that emits green light (e.g. β sialon phosphor). Accordingly, it is possible to expand the color reproduction range of the display using the light emitting device.

For the phosphor, for example, a phosphor that has a central particle diameter of 100 μm or less, preferably 50 μm or less, and more preferably 30 μm or less can be used. The central particle diameter can be measured and calculated using a particle measuring device or particle size distribution measuring device that are commercially available, of the like. The particle diameter described above refers to a particle diameter obtained using an air permeability method using Fisher Sub Sieve Sizer (F. S. S. S).

Filler

Various types of filler may be contained in the first resin. For example, by adding nanoparticles, it is possible to increase the viscosity and thixotropy of the resin, and to increase the phosphor dispersion. It is also possible to increase scattering including Rayleigh scattering of the blue light of the light emitting element, and to reduce the amount of phosphor used. As used herein, "nanoparticles" refers to particles with the particle diameter of 1 nm-100 nm.

Adding filler such as alumina, silica, etc., of particle diameter 1-50 μm, with a different refractive index from the resin also allows for increasing scattering and allows for reducing the amount of phosphor used, and also allows variation of the light distribution of the light emitting device less likely to occur, increasing extraction efficiency.

Examples of these fillers include silica, alumina, zirconia, and zinc oxide. For the filler, it is possible to use one of these, or two or more of these in combination. Nanosilica, with which it is possible to adjust the thixotropy of the first resin, is particularly preferable.

The filler may also be used for adjusting the external color of the first resin 30. When adjusting an external color of the first resin 30 to black color, it is possible to use black silica, titanium oxynitride, carbon particles, etc. When adjusting an external color of the first resin 30 to white color, as the white color filler, it is possible to use titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, etc. One of these fillers, or two or more of these fillers can be used in a combination.

First Support 10, Second Support 20

The first support and the second support may have the same configuration, or may have different configurations. It is preferable that the first support and the second support have the same configuration. More specifically, it is preferable that the first support and the second support have the same materials, approximately the same size, and approximately the same thickness. With the same configuration of the first support and the second support, difference in expansion and contraction between the first and second supports can be reduced, so it is possible to easily obtain a stable light-transmissive sheet.

The first support 10 and the second support 20 (hereafter collectively referred to as "supports") are film-like members having a flat surface on which the first resin 30 can be placed. For the supports, it is possible to use a thermoplastic resin film, or a heat or photo-curable resin film. For example, it is possible to use a polytetrafluoroethylene film, a polyethylene terephthalate film, a polyethylene film, a glass film, a polyester film, a polyamide film, a triacetyl cellulose film, or a polyolefin film. A single layer of one of these, or a layered structure of two or more of these can be used. Among these, it is preferable to use a polytetrafluoroethylene film, or a polyethylene terephthalate film which have high heat resistance temperature and good detachability from resin.

The first support of the second support can have a shape selected as appropriate according to the light-transmissive sheet shape, etc.

For example, it is preferable to be rectangular. When the first support or the second support is a rectangle, for example, a length of the first support or the second support (i.e., size in the longitudinal direction) can be selected as appropriate according to a method of manufacturing the light-transmissive sheet, but when the method of placing the first resin 30A on the first support 10 is a batch type manufacturing method such as printing, etc., a length of the rectangular shape is suitably in a range of 0.01 to 1 m.

On the other hand, in the case of a continuous type manufacturing method such as coating, etc., 1 to 2000 m is suitable. A width of the first support or the second support (i.e., size in the short direction) can be selected as appropriate according to the size of the light-transmissive sheet, and is preferably in a range of 5 to 500 mm. The first support or the second support can have any appropriate thickness, and a thickness thereof is generally in a range of 5 to 1000 µm, preferably 10 to 500 µm, and more preferably 30 to 200 µm. When the first support or the second support is too thin, elongation of these tends to occur easily, and an adverse effect occurs for variation of the thickness of the first resin. On the other hand, when the first support or the second support is too thick, the cost may be increased. Thickness of the first support or the second support may be varied according to the thickness of the light-transmissive sheet being produced, and for example, in view of uniformity of the thickness of the light-transmissive sheet, is 10 µm or less, and more preferably 5 µm or less.

Embodiment 2

Figure 3:
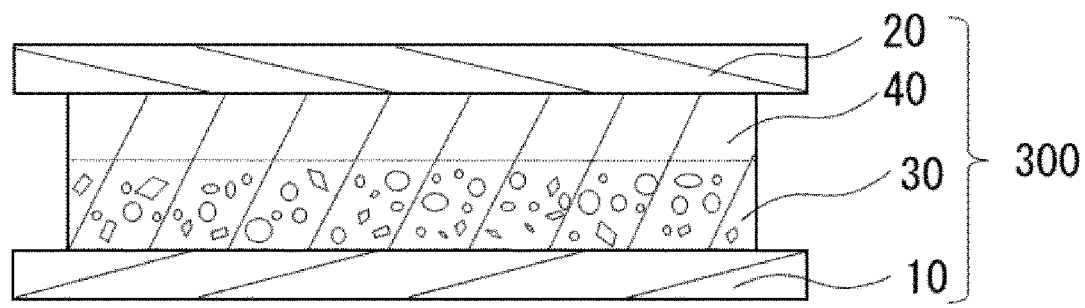
FIG. 3 is a schematic cross-sectional view of the light-transmissive sheet of Embodiment 2.

FIG. 3 is a schematic cross-sectional view showing an example of a light-transmissive sheet 300 of Embodiment 2. FIG. 4A to 4H are schematic cross-sectional process diagrams of a method of manufacturing the light-transmissive sheet of Embodiment 2.

The method of manufacturing the light-transmissive sheet of Embodiment 2 is basically the same as the method of manufacturing the light-transmissive sheet of Embodiment 1, other than including a step of placing a second resin 40 (second resin member) on the top surface of the second support 20 of Embodiment 1. Also, the method for placing the second resin 40 on the top surface of the second support 20 can be selected as appropriate from among the methods for placing the first resin 30 on the top surface of the first support 10 in Embodiment 1.

Figure 4A:
FIG. 4A is a schematic cross-sectional process diagram showing the method of manufacturing the light-transmissive sheet of Embodiment 2.
Figure 4B:
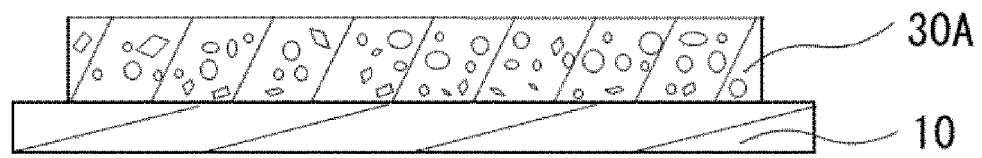
FIG. 4B is a schematic cross-sectional process diagram showing the method of manufacturing the light-transmissive sheet of Embodiment 2.
Figure 4C:
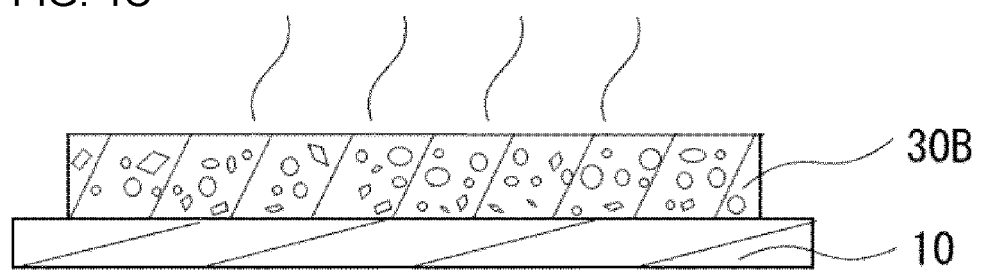
FIG. 4C is a schematic cross-sectional process diagram showing the method of manufacturing the light-transmissive sheet of Embodiment 2.

The method of manufacturing the light-transmissive sheet of Embodiment 2 is described below. As shown in FIG. 4A to 4C, the first support 10 and the first resin 30B disposed on the top surface of the first support 10 is prepared in a manner basically the same as in the step of preparing the first support on Embodiment 1.

2. Preparing the Second Support 20

2-1. Preparing the Second Support 20

Figure 4D:
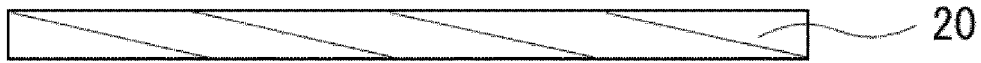
FIG. 4D is a schematic cross-sectional process diagram showing the method of manufacturing the light-transmissive sheet of Embodiment 2.

The second support 20 is prepared as shown in FIG. 4D. The second support 20 can be the same as that used in Embodiment 1. The second support 20 in this embodiment serves as a second support base member on which the second resin member is placed.

2-2. Placing the A-Stage Second Resin 40 on the Top Surface of the Second Support 20

Figure 4E:
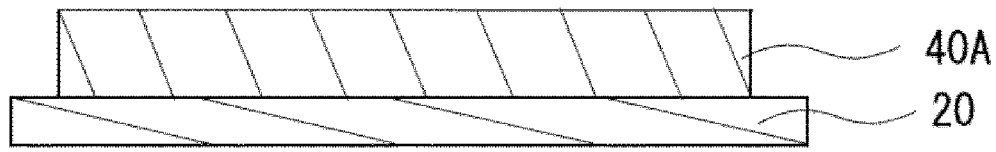
FIG. 4E is a schematic cross-sectional process diagram showing the method of manufacturing the light-transmissive sheet of Embodiment 2.

As shown in FIG. 4E, the A-stage second resin 40 (hereafter referred to as "second resin 40A") is placed on the top surface of the second support 20. The method for placing method can be the same as when placing the first resin 30A on the top surface of the first support 10 with Embodiment 1. A thickness of the second resin 40A can be selected as appropriate according to the purpose of use. For example, the second resin 40A preferably has thickness of approximately 0.1 µm to 1000 µm, and more preferably 10 µm to 200 µm. For example, in the case of the second resin 40 containing phosphor, variation in thickness of the second resin 40 may be a cause of variation in color of the light emitting device manufactured using the light-transmissive sheet. Accordingly, it is preferable that the second resin 40A be formed having approximately uniform thickness, and that variation in thickness be less than 10% of the thickness of the second resin 40A, and more preferably less than 5%.

2-3. Converting A-Stage Second Resin to B-Stage

Figure 4F:
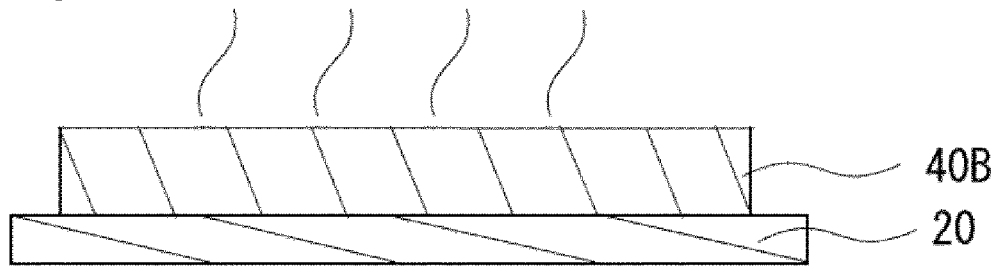
FIG. 4F is a schematic cross-sectional process diagram showing the method of manufacturing the light-transmissive sheet of Embodiment 2.

As shown in FIG. 4F, the second resin 40A placed on the top surface of the second support 20 is heated to obtain the B-stage second resin 40 (hereafter referred to as "second resin 40B"). The method for converting to the B-stage can be basically the same as converting the A-stage first resin 30 to the B-stage in section 1-3 of Embodiment 1.

3' Forming into the C-Stage First Resin and C-Stage Second Resin

3'-1. Laminating the First Support 10 and the Second Support 20

Figure 4G:
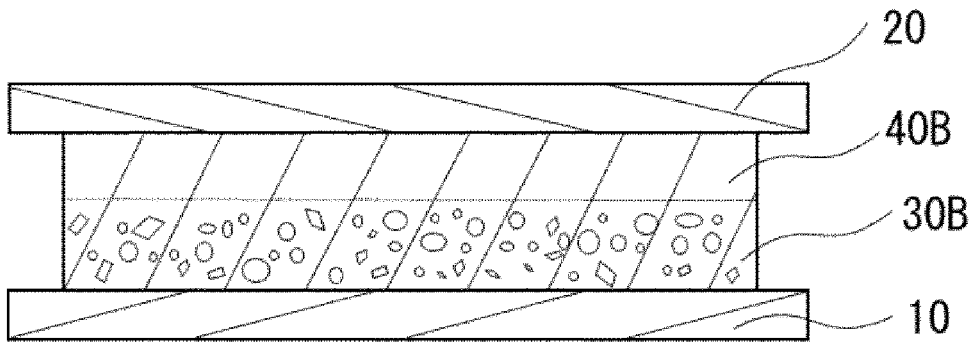
FIG. 4G is a schematic cross-sectional process diagram showing the method of manufacturing the light-transmissive sheet of Embodiment 2.

As shown in FIG. 4G, the first support 10 having the top surface on which the first resin 30B is placed, and the second support 20 having the top surface on which the second resin 40B is placed are laminated. More specifically, lamination is performed so that a surface of the first resin 30B opposite to the surface on which the first support 10 is placed, and the surface of the second resin 40B opposite to a surface on which the second support 20 is placed are in contact with each other. The lamination method can be basically the same as the lamination of the second support 20 in section 3-1 of Embodiment 1.

3'-2. Converting to the C-stage

Figure 4H:
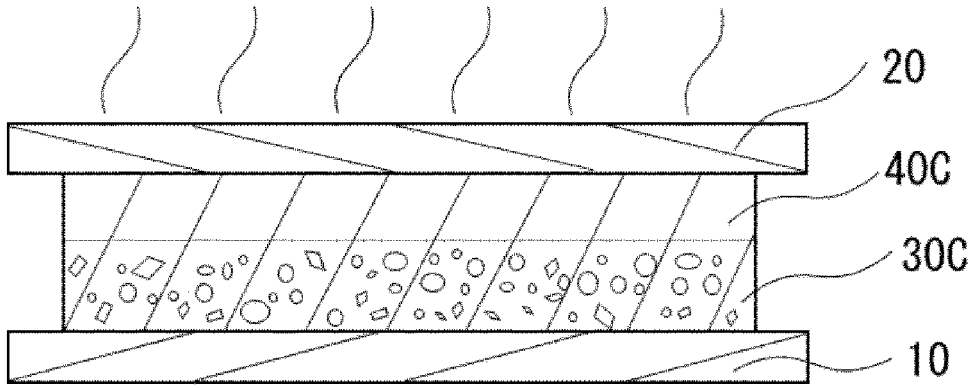
FIG. 4H is a schematic cross-sectional process diagram showing the method of manufacturing the light-transmissive sheet of Embodiment 2.

As shown in FIG. 4H, in a state where the first support 10, the first resin 30B, the second resin 40B, and the second support 20 are laminated, the first resin 30B and the second resin 40B are converted to the C-stage to obtain the light-transmissive sheet 300 including the first resin 30C and the second resin in the C-stage (hereinafter referred to as "second resin 40C").

The method for converting the first resin and the second resin to the C-stage can be basically the same as converting the first resin 30B to the C-stage in section 3-2 of Embodiment 1.

Second Resin 40

The second resin 40 can be have light-transmissivity, similarly to the first resin 30, and can be a single layer of one of the materials that can be used for the first resin 30 as described above, or can be a layered structure of two or more of these materials. For the second resin, it is also possible to use a resin of a different configuration from that of the first resin. The second resin 40 may also contain phosphor and/or a filler.

Embodiment 3

Figure 5:
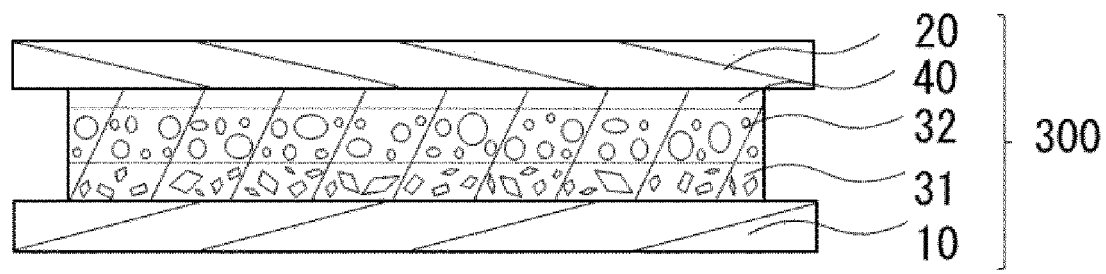
FIG. 5 is a schematic cross-sectional view of the light-transmissive sheet of Embodiment 3.

FIG. 5 is a schematic cross-sectional view showing an example of the light-transmissive sheet of Embodiment 3. FIG. 6A to 6M are schematic cross-sectional process diagrams of the method of manufacturing the light-transmissive sheet of Embodiment 3.

The method of manufacturing the light-transmissive sheet of Embodiment 3 is basically the same as the method of manufacturing the light-transmissive sheets of embodiments 1 and 2 other than that the first resin 30 of Embodiment 1 includes at least a first resin layer 31 and a second resin layer 32.

The method of manufacturing the light-transmissive sheet of Embodiment 3 is described below.

The manufacturing method of Embodiment 3 includes:

(1) preparing the First support 10 (FIG. 6A), (2) placing the A-stage first resin layer 31A on the top surface of the first support 10 (FIG. 6B), (3) heating the first resin layer 31A placed on the top surface of the first support 10 to obtain a B-stage first resin layer 31B (FIG. 6C), (4) preparing a third support 21 (FIG. 6D), (5) placing an A-stage second resin layer 32A on the top surface of the third support 21 (FIG. 6E), (6) heating the second resin layer 32A placed on the top surface of the third support 21 to obtain a B-stage second resin layer 32B (FIG. 6F), (7) laminating the first resin layer 31B and the second resin layer 32B so as to be disposed between the first support 10 and the third support 21, making the first resin 30B (FIG. 6G), (8) removing the third support 21 (FIG. 6H), (9) preparing the second support 20 (FIG. 6I),

(10) placing the A-stage second resin 40A on the top surface of the second support 20 (FIG. 6J),

(11) heating the second resin 40A placed on the top surface of the second support 20 to obtain the B-stage second resin 40B (FIG. 6K),

(12) laminating the first resin 30B and the second resin 40B so as to be disposed between the first support 10 and the second support 20 (FIG. 6L), and

Figure 6A:
FIG. 6A is a schematic cross-sectional process diagram showing the method of manufacturing the light-transmissive sheet of Embodiment 3.
Figure 6B:
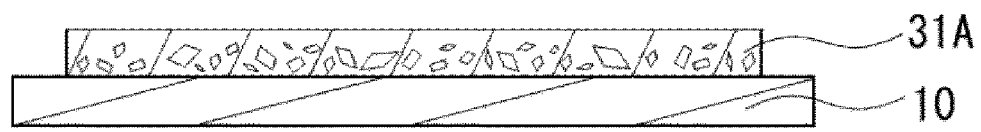
FIG. 6B is a schematic cross-sectional process diagram showing the method of manufacturing the light-transmissive sheet of Embodiment 3.
Figure 6C:
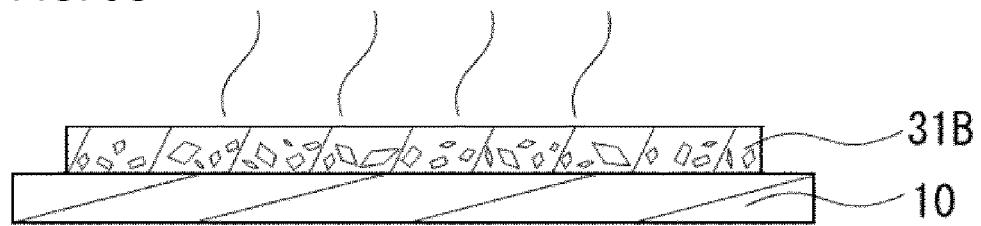
FIG. 6C is a schematic cross-sectional process diagram showing the method of manufacturing the light-transmissive sheet of Embodiment 3.
Figure 6D:
FIG. 6D is a schematic cross-sectional process diagram showing the method of manufacturing the light-transmissive sheet of Embodiment 3.
Figure 6E:
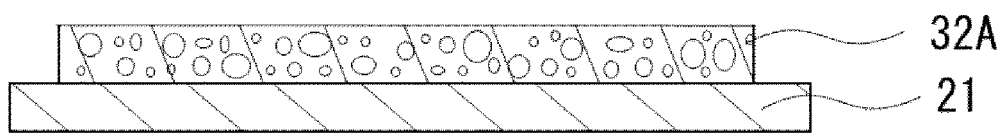
FIG. 6E is a schematic cross-sectional process diagram showing the method of manufacturing the light-transmissive sheet of Embodiment 3.
Figure 6F:
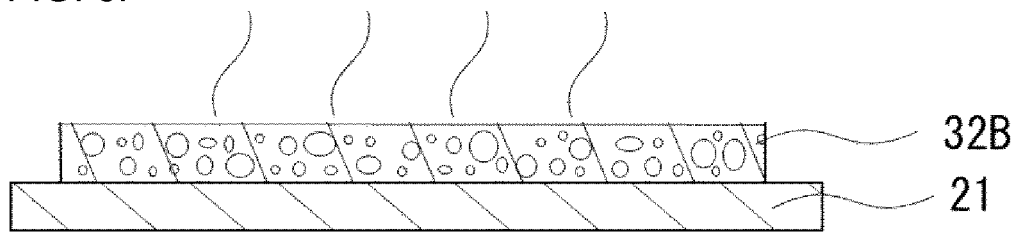
FIG. 6F is a schematic cross-sectional process diagram showing the method of manufacturing the light-transmissive sheet of Embodiment 3.
Figure 6G:
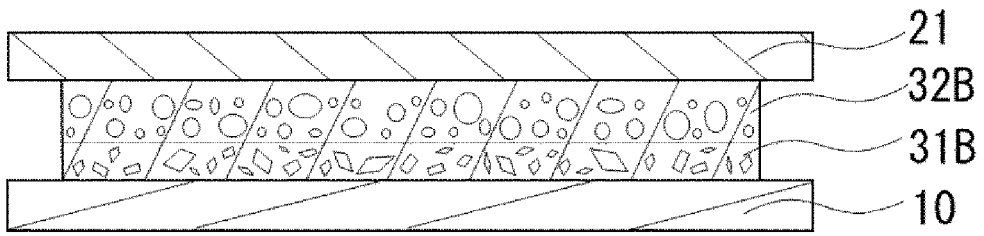
FIG. 6G is a schematic cross-sectional process diagram showing the method of manufacturing the light-transmissive sheet of Embodiment 3.
Figure 6H:
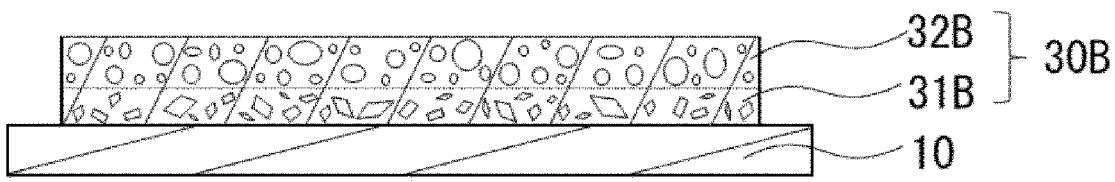
FIG. 6H is a schematic cross-sectional process diagram showing the method of manufacturing the light-transmissive sheet of Embodiment 3.
Figure 6I:
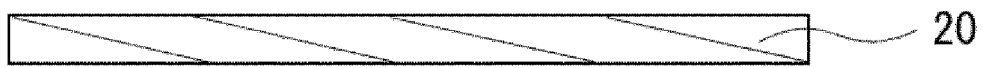
FIG. 6I is a schematic cross-sectional process diagram showing the method of manufacturing the light-transmissive sheet of Embodiment 3.
Figure 6J:
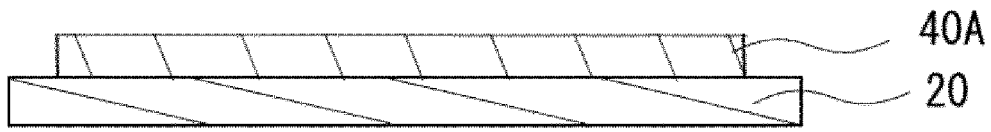
FIG. 6J is a schematic cross-sectional process diagram showing the method of manufacturing the light-transmissive sheet of Embodiment 3.
Figure 6K:
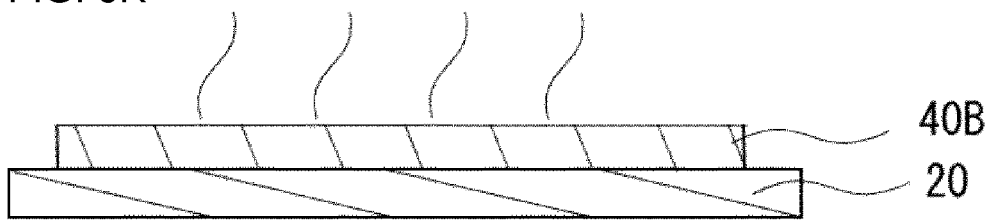
FIG. 6K is a schematic cross-sectional process diagram showing the method of manufacturing the light-transmissive sheet of Embodiment 3.
Figure 6L:
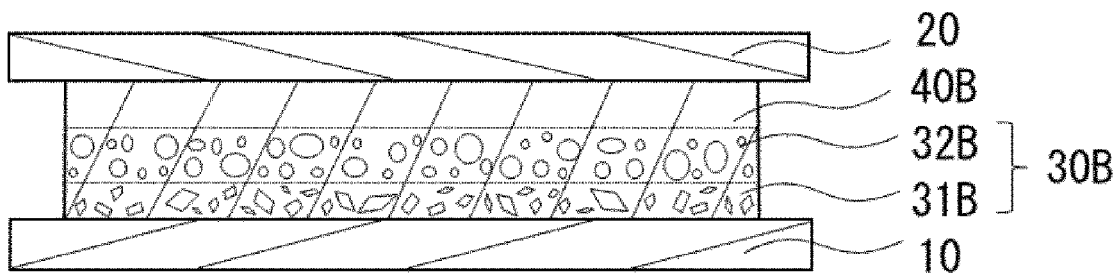
FIG. 6L is a schematic cross-sectional process diagram showing the method of manufacturing the light-transmissive sheet of Embodiment 3.
Figure 6M:
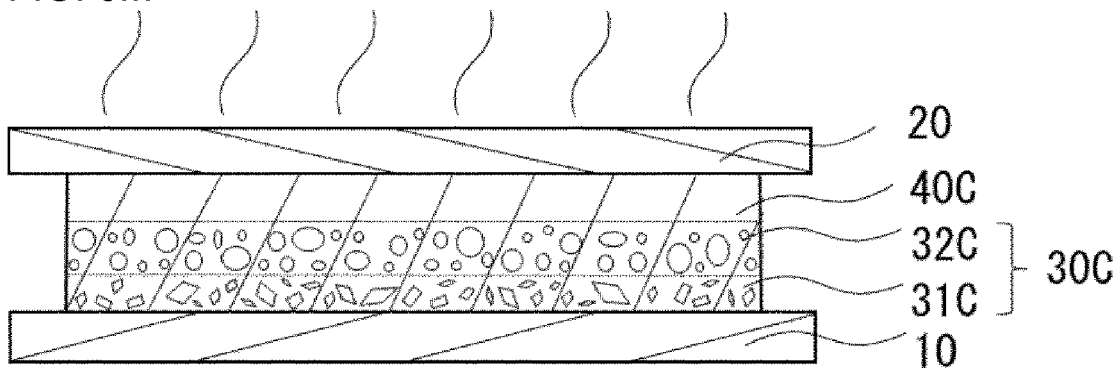
FIG. 6M is a schematic cross-sectional process diagram showing the method of manufacturing the light-transmissive sheet of Embodiment 3.

(13) heating the first resin 30B and the second resin 40B to convert to the C-stage to obtain the first resin 30C and a second resin 40C (FIG. 6M).

Placing the first resin layer 31 on the top surface of the first support 10 shown in FIG. 6A to 6C, placing the second resin layer 32 on the top surface of the third support 21 shown in FIG. 6D to 6F, and placing the second resin 40B on the top surface of the second support 20 shown in FIG. 6I to 6K are basically the same as those in the steps of preparing the first support 10 in section 1 of Embodiment 1.

Also, as shown in FIGS. 6G and 6L, the step for laminating the first support 10 and the second support 20, and the step for laminating the first support 10 and the third support 21 are basically the same as the steps for laminating the first support 10 and the second support 20 in section 3' of Embodiment 2.

Configurations that greatly differ from the other embodiments are described below.

(8) Removing the Third Support 21

The third support 21 is removed from the second resin layer in the B-stage (hereinafter referred to as "second resin layer 32B") as shown in FIG. 6H.

For example, it is preferable that the size of the second resin layer 32B placed on the top surface of the third support 21 be placed to be smaller than the third support 21. With such a size, at the outer periphery of the third support 21, an area on which the second resin layer 32B is not placed can be held, and thethird support 21 can be easily removed from the second resin layer 32B.

In this manner, by removing the third support, the first resin 30B in which the first resin layer in the B-stage (hereinafter referred to as "first resin layer 31B") and the second resin layer 32B are laminated on the top surface of the first support 10 can be obtained.

The third support 21 can be the same as the first support 10 or the second support 20.

The first resin 30B including the first resin layer 31B and the second resin layer 32B can be also formed by, for example, placing the first resin layer 31 in the A-stage (hereinafter referred to as "first resin layer 31A") on the first support 10, converting the first resin layer 31A to the B-stage, and then placing the second resin layer in the A-stage (hereinafter referred to as "first resin layer 32A") and converting to the B-stage. The first resin layer 31 and the second resin layer 32 may also be formed by, after placing the first resin 30A containing phosphor or filler on the first support 10, having the phosphor or filler undergo sedimentation using a method such as centrifugal sedimentation, etc.

(12) Laminating the First Support 10 and the Second Support 20

As shown in FIG. 6L, lamination is performed so that a surface of the second resin 40B opposite to a surface thereof on which the second support 20 is placed is in contact with a surface of the first resin 30B opposite to a surface thereof on which the first support 10 is placed. This step is basically the same as the step of laminating the first support 10 and the second support 20 in section 3' of Embodiment 2.

(13) Converting to C-stage

As shown in FIG. 6M, the conversion to C-stage is performed in a state where the first support 10, the first resin 30B, the second resin 40B, and the second support 20 are laminated so that the first resin layer 31B, the second resin layer 32B and the second resin 40B are converted to the first resin layer in the C-stage (the first resin layer 31C), the second resin layer in the C-stage (the second resin layer 32C) and the second resin in the C-stage. The method of converting to the C-stage is basically the same as that in section 3-2 of Embodiment 1.

Modified Example

A modification example of the light-transmissive sheet is described below.

Figure 7A:
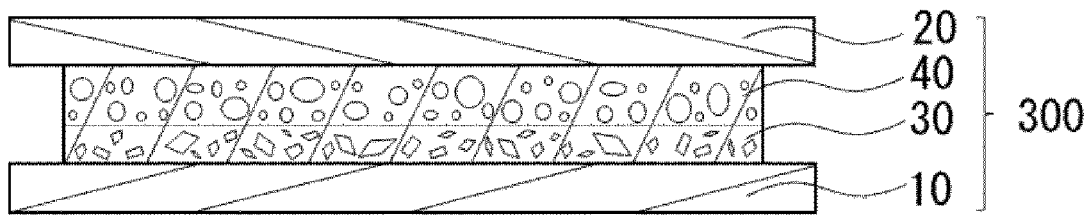
FIG. 7A is a schematic cross-sectional view of a light-transmissive sheet of a modification example.

FIG. 7A shows a light-transmissive sheet 300 according to the modified example in which the first resin 30 containing a phosphor that emits green light and the second resin 40 containing a phosphor that emits red light are laminated. A method of manufacturing the light-transmissive sheet 300 according to the modified example is basically the same other than that a red phosphor is contained in a first resin 30 that is the same as that in Embodiment 2, and a second resin 40 contain a green phosphor. The second resin 40C is adhered to the light emitting element, so that it is possible to prevent the red phosphor from being contacted to the light emitting element, preventing degradation of the red phosphor due to heat. Also, the red phosphor and the green phosphor are unevenly distributed in the first resin 30 and the second resin 40C, respectively, without mixing the red phosphor and the green phosphor, so that it is possible to reduce light absorption by the phosphors with each other, and possible to improve the light extraction efficiency.

Figure 7B:
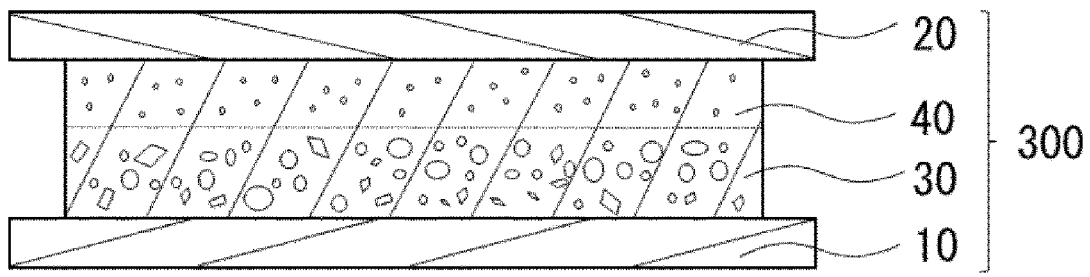
FIG. 7B is a schematic cross-sectional view of a light-transmissive sheet of a modification example.

FIG. 7B shows the light-transmissive sheet in which the first resin 30 containing a phosphor and the second resin 40 containing a filler are laminated. A method of manufacturing the light-transmissive sheet is basically the same as Embodiment 2 other than containing a filler in the resin. With a filler added to the second resin 40, scattering can be increased, and the amount of phosphor used can be reduced, and also variation in light distribution of the light emitting device does not occur easily, so that it is possible to produce the light-transmissive sheet 300 with improvement in light emission efficiency.

Figure 7C:
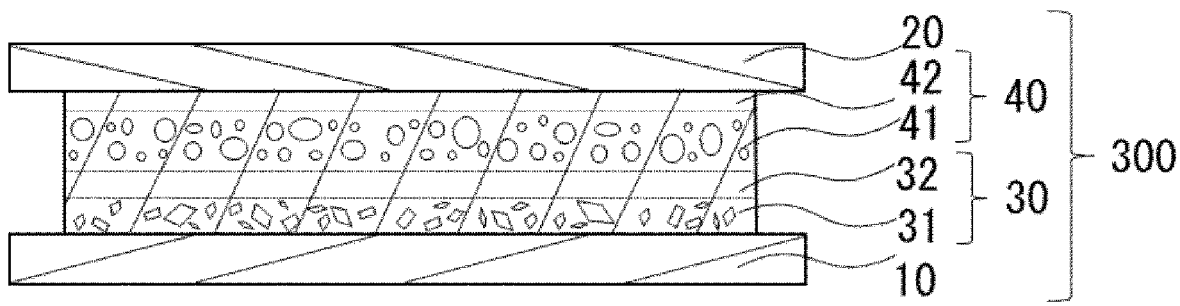
FIG. 7C is a schematic cross-sectional view of a light-transmissive sheet of a modification example.

FIG. 7C shows the light-transmissive sheet 300 in which the first resin layer 31 and the second resin layer 32 are laminated in the first resin 30, and the first resin layer 41 and the second resin layer 42 are laminated in the second resin. The method of manufacturing the light-transmissive sheet 300 as shown in FIG. 7C is basically the same as that of Embodiment 3 other than the number of laminations. With this configuration, it is possible to prevent the phosphor from being in direct contact with outside air, so it is possible to reduce degradation of the phosphor due to moisture and corrosive gas in the outside air.

The light-transmissive sheet in FIG. 7A-C can be performed by, for example, repeatedly performing (4) to (8) of Embodiment 3 to laminate resins in a plurality of layers.

Light Emitting Device

Figure 9A:
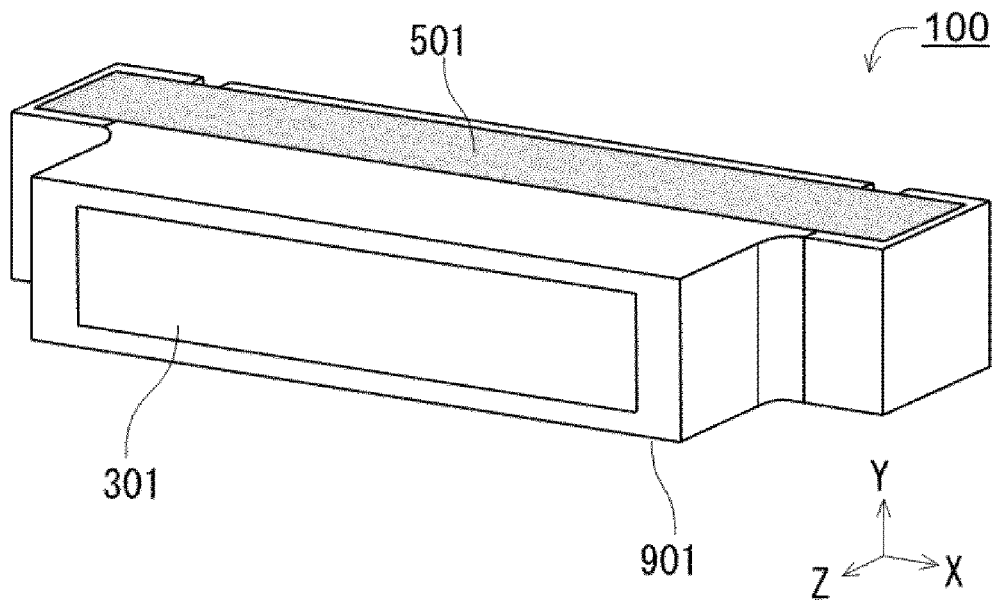
FIG. 9A is a schematic perspective view of a light emitting device used with the light-transmissive sheet of Embodiment 2.
Figure 9B:
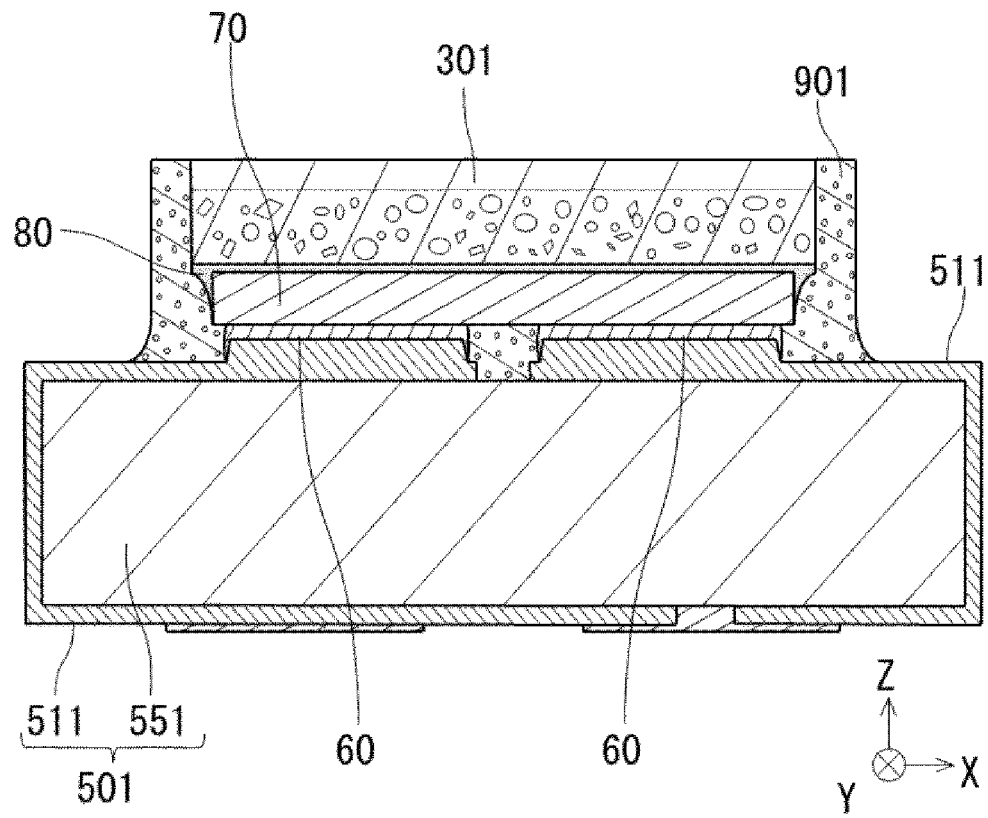
FIG. 9B is a schematic perspective view of the light emitting device used with the light-transmissive sheet of Embodiment 2.

As shown in FIGS. 9A and 9B, for example, the light emitting device 100 using the light-transmissive sheet 300 of Embodiment 2 is provided with a singulated substrate 501, an electrically conductive adhesive member 60, a light emitting element 70, an adhesive member 80, a light-transmissive member 301, and a reflective member 901. The singulated substrate 501 has a wiring 511 and a base 551 for holding that wiring 511. The light emitting element 70 is a light emitting diode chip that is elongated in the X direction and is shorter in the Y direction. The light emitting element 70 is flip-chip mounted on the wiring 511 of the singulated substrate via the electrically conductive adhesive member 60. The light-transmissive member 301 is a rectangular parallelepiped small piece that is longer in the X direction and shorter in the Y direction. The light-transmissive member 301 is of a size that allows for covering and hiding an entirety of the light emitting element 70 in the front view. The light-transmissive member 301 is adhered on the light emitting element 70 via the adhesive member 80. The reflective member 901 is formed on the singulated substrate 501, and covers the lateral surfaces of the light emitting element 70, the lateral surfaces of the adhesive member 80, and the lateral surfaces of the light-transmissive member 301. The reflective member 901 surrounds the entire lateral side of the side of the light emitting element 70 and the light-transmissive member 301. The front surface of the light-transmissive member 301 and the front surface of the reflective member 901 substantially constitutes the same surface.

The wiring 511 is a member singulated from a wiring 51. The base 551 is singulated from a base 55. The reflective member 901 is singulated from the reflective member 90. The light emitting device 100 having configurations as described above has a substantially uniform thickness of the light-transmissive member, and exhibits a substantially uniform light emission color with reduced color unevenness.

Method of Manufacturing a Light Emitting Device

In a method of manufacturing the light emitting device, it is possible to use any of the light-transmissive sheets shown in embodiments 1 to 3. As an example, a method of manufacturing the light emitting device using the light-transmissive sheet 300 of Embodiment 2 is will be described while referring to the drawings.

The method of manufacturing the light emitting device 100 includes:

(1) preparing the light-transmissive sheet,
(2) removing the light-transmissive sheet from the support to prepare the light-transmissive member,
(3) preparing the light emitting element having a main light emitting surface and an electrode forming surface opposite to the main light emitting surface,
(4) placing the light-transmissive sheet on the main light emitting surface, and
(5) covering the lateral surface of the light emitting element with the reflective member.

(1) Preparing the Light-Transmissive Sheet

The light-transmissive sheet manufactured in embodiments 1 to 3 is prepared. The light-transmissive sheet may include a layer containing a phosphor, a layer containing a filler, etc., as appropriate in accordance with use. Hereinafter, as an example, a case of using the light-transmissive sheet comprising the first resin and the second resin will be described.

Figure 8:
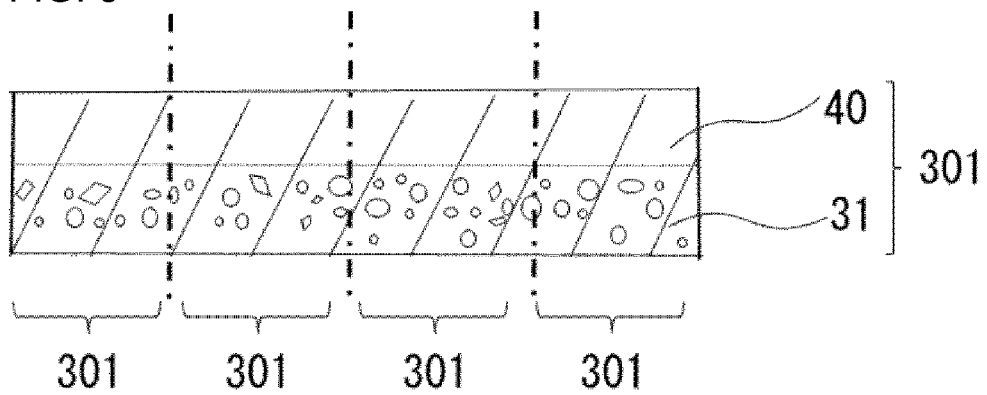
FIG. 8 is a schematic cross-sectional process diagram of a light-transmissive sheet of Embodiment 2.

(2) Removing the Supports from the Light-Transmissive Sheet to Prepare the Light-Transmissive Member The first support 10 and the second support 20 are removed from the light-transmissive sheet 300 to obtain the light-transmissive member 301 as shown in FIG. 8. The size of the light-transmissive member 301 is preferably the size of the main light emitting surface of the light emitting element described later or greater, and as shown in FIG. 8, may be singulated to be a required size. Singulation can be performed by Thomson blade cutting, dicer cutting, laser scribing, cutler scribing, etc.

In dicer cutting, machining speed is fast and the dimensional accuracy is high, and thus dicer cutting is preferable.

(3) Preparing the Light Emitting Element

Figure 10:
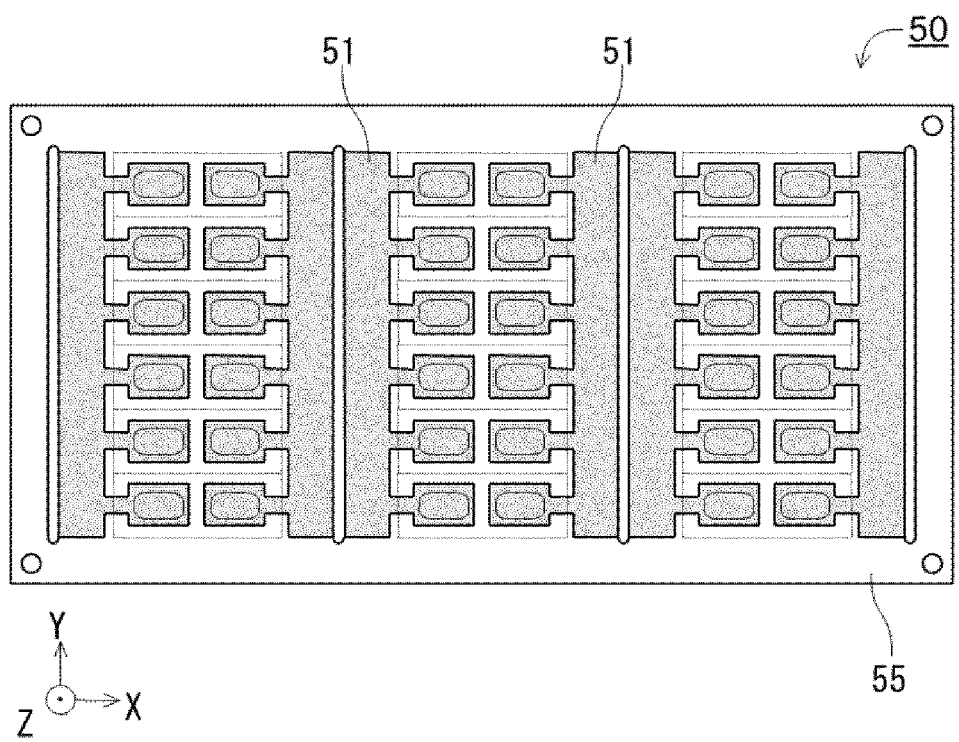
FIG. 10 is a schematic top view of an example of a substrate used in the manufacturing of the light emitting device of Embodiment 2.
Figure 11A:
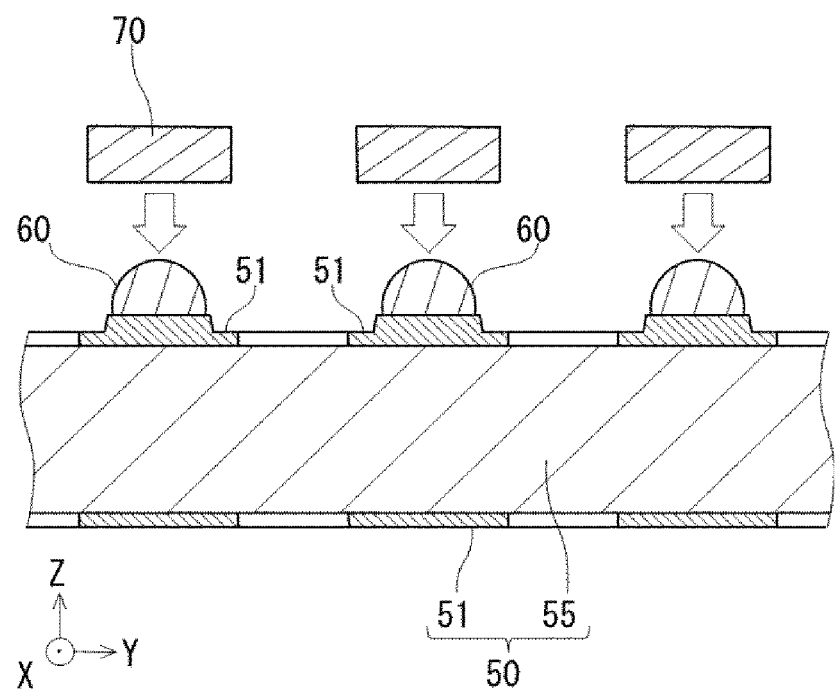
FIG. 11A is a schematic cross-sectional process diagram of the method of manufacturing the light emitting device of Embodiment 2.

Next, as shown in FIG. 11A, the light emitting element 70 is placed on the top surface of the substrate 50 via the electrically conductive adhesive member 60. As shown in FIG. 9, the light emitting element 70 has an electrode forming surface opposite to the main light emitting surface, and is placed so that the substrate 50 faces electrodes of the light emitting element 70. As shown in FIG. 10, the substrate 50 is a mounting substrate which has the wiring 51 and the base 55.

For the light emitting element 70, a light emitting element having a size of 1100×200×300 μm is used, for example. The outline of the top surface of the light emitting element 70 is the same size or slightly smaller than the outline of the light-transmissive member.

(4) Placing the Light-Transmissive Member on the Main Light Emitting Surface

Figure 11B:
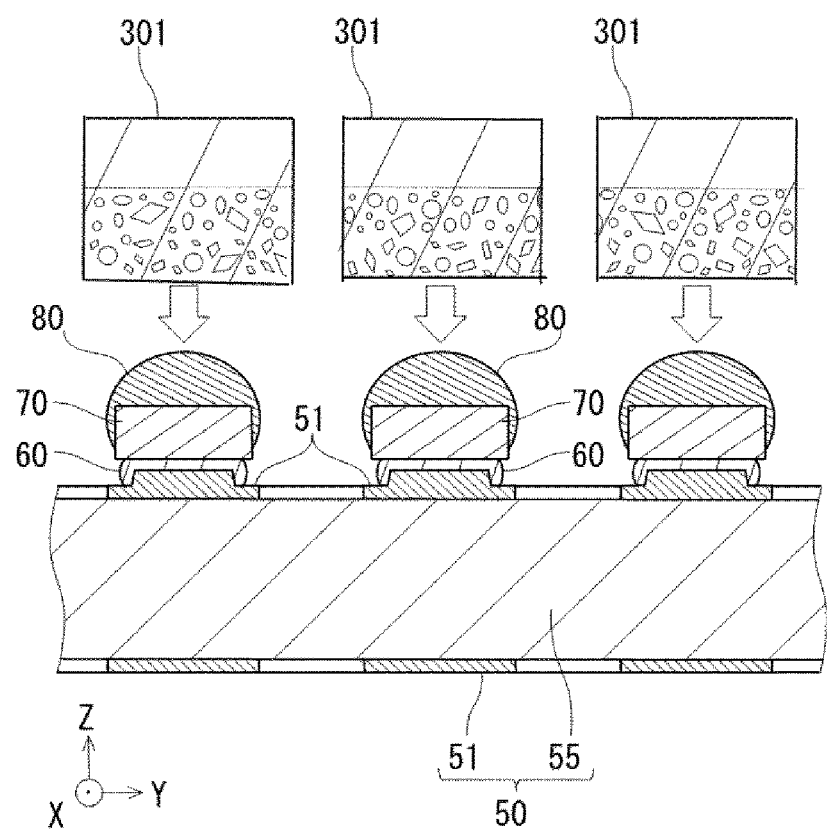
FIG. 11B is a schematic cross-sectional process diagram of the method of manufacturing the light emitting device of Embodiment 2.

Next, as shown in FIG. 11B, the light-transmissive member 301 is placed on the main light emitting surface of the light emitting element 70. At this time, with the light-transmissive adhesive member 80 disposed on the main light emitting surface, the light emitting element 70 and the light-transmissive member 301 are fixed together. In other words, the light-transmissive sheet is placed on the light extraction surface side of the light emitting device.

When the light-transmissive member 301 includes a layer containing phosphor and a layer that contains substantially no phosphor, it is preferable that the layer that contains substantially no phosphor be the outermost layer. Accordingly, it is possible to reduce degradation of the phosphor due to outside air or moisture during manufacturing or use of the light emitting device.

Figure 11C:
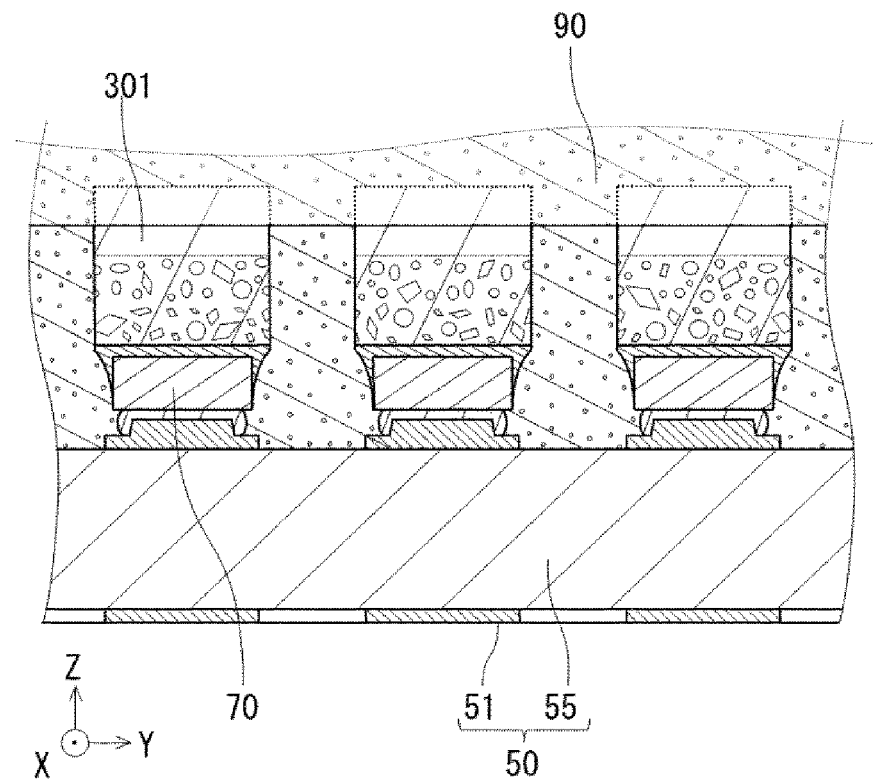
FIG. 11C is a schematic cross-sectional process diagram of the method of manufacturing the light emitting device of Embodiment 2.

(5) Covering the Lateral Surfaces of the Light Emitting Element with the Reflective Member Next, as shown in FIG. 11C, the reflective member 90 is disposed to cover the lateral surfaces of the light emitting element 70, and the lateral surfaces and the top surface of the light-transmissive member 301. The reflective member 90 is made of a resin containing 40 to 60 wt % of titanium oxide, etc.

The space between the light emitting element 70 and the singulated substrate 501 is also covered by the reflective member 90.

After curing of the reflective member 90, the reflective member 901 on the light-transmissive member 301 is removed to expose the top surface of the light-transmissive member 301. Accordingly, the light emitted from the light emitting element 70 in a direction toward the substrate can be introduced to the light-transmissive member 301 through a surface of that is not covered by the reflective member 90.

Figure 11D:
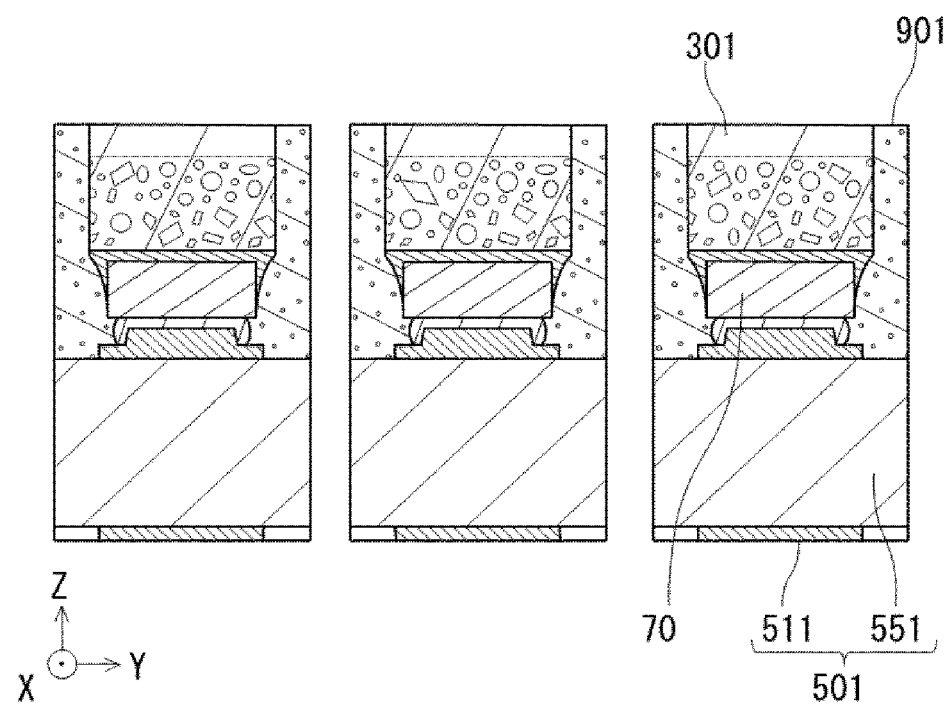
FIG. 11D is a schematic cross-sectional process diagram of the method of manufacturing the light emitting device of Embodiment 2.

At the time of singulating, as shown in FIG. 11D, the substrate 50 and the reflective member 90 between the light emitting elements is cut using dicer cutting, etc. In the step of singulating, cutting may be performed for each light emitting element or for every two or more light emitting elements. Cutting for every two or more light emitting element allows for forming a light emitting device including a plurality of light emitting elements.

Materials or the like appropriate for each constituent member of the light emitting device will be described below.

Light Emitting Element 70

For the light emitting element 70 used herein, it is possible to use any appropriate light emitting element generally used in this field. Examples of the blue and green light emitting elements include light emitting elements using a semiconductor layer such as of ZnSe, a nitride based semiconductor ($In_XAl_YGa_{1-X-Y}N$, $0 \le X$, $0 \le Y$, $X+Y \le 1$), GaP, etc., and examples of the red color light emitting element include a light, emitting element using a semiconductor layer such as GaAlAs, AlInGaP, etc.

Generally, a semiconductor layer is layered on an insulating substrate for semiconductor growth such as sapphire, etc., to form a light emitting element, but the substrate for semiconductor growth may be removed.

Electrodes may be disposed on opposite sides of the light emitting element, but preferably the electrodes are disposed on the same side. With this arrangement, it is possible to perform mounting in a face-down manner in which the electrodes are bonded to the substrate 50. However, the light emitting element may alternatively have a face down structure having a growth substrate, a face down structure or a vertical structure that does not have a growth substrate, a face up structure having a growth substrate, a face up structure that does not have a growth substrate, etc.

For the light emitting element 70, a light emitting element having is the same size as or a size smaller than the size of the outer periphery of the light-transmissive member 301 in the plan view is preferably used. Accordingly, it is possible to efficiently introduce approximately all the light emitted from the light emitting element 70 to the light-transmissive member 301, and possible to increase the extraction of light from the light emitting device 100. On the other hand, in the plan view, a light emitting element having the same size as the outer periphery of the light-transmissive member 301 (i.e., outer periphery of the light emitting element approximately corresponds to the outer periphery of the light-transmissive member 301) or greater than the outer periphery of the light-transmissive member 301. In this case, it is possible to form the light emitting device 100 with a smaller light extraction surface and with higher luminance.

Adhesive Member 80

Fixing of the light-transmissive member 301 to the top surface of the light emitting element 70 can be performed using the light-transmissive adhesive member 80, for example. The adhesive member 80 can be any appropriate adhesive member that allows for ensuring light-transmissivity, and with which the light-transmissive member 301 can be fixed to the light emitting element. Also, a material that is not easily degraded due to light is preferable. Examples of the light-transmissive member 301 include a silicone based adhesive, an epoxy based adhesive, a silicone epoxy hybrid based adhesive, etc. Fixing of the light-transmissive member 301 can be performed with the adhesiveness or stickiness of the light-transmissive member 301.

When using the light emitting element 70 having the outer periphery smaller than the light-transmissive member 301 in the plan view, the adhesive member 80 can be formed to have a shape that expands from the outer periphery of the top surface of the light emitting element 70 to the outer periphery of the lower surface of the light-transmissive member 301. Also, when using the light emitting element 70 having the outer periphery is larger than the light-transmissive member 301 in the plan view, it is possible to form the adhesive member 80 to have a shape that expands from the outer periphery of the bottom surface of the light-transmissive member 301 to the outer periphery of the top surface of the light emitting element 70. In view of forming the light emitting device 100 having a large contrast difference between the light emitting area and the non-light emitting area thereof, it is preferable that the outer periphery of the adhesive member 80 be located inward of the outer periphery of the light-transmissive member 301, the outer periphery of the adhesive member 80 covered with the reflective member 901.

Substrate 50

As described above, the light emitting element 70 is preferably mounted on the substrate 50. The substrate 50 may be any appropriate substrate, and may be a substrate having a so-called positive and negative terminals for mounting one light emitting element, or may be a substrate having a wiring pattern for mounting a plurality of light emitting elements.

With any of the substrates described above, the substrate has an insulating base material, and an electrically conductive terminal or wiring pattern formed on the surface thereof. The base material and the material forming the terminal or wiring pattern, the shape, size, etc., can be selected as appropriate in accordance with the configuration of the light emitting device to be obtained.

The light emitting element can be mounted in a face up manner in which the growth substrate side of the light emitting element (reverse side to the electrode forming surface side) bonded onto the substrate, but is preferably mounted on the substrate in a face-down manner.

Electrically Conductive Adhesive Member 60

Mounting of the light emitting element 70 on the substrate is performed with the electrically conductive adhesive member 60 disposed between the substrate and the light emitting element 70. Examples of the electrically conductive adhesive member 60 include tin-bismuth type, tin-copper type, tin-silver type, gold-tin type, etc., solder, eutectic alloys such as alloys with Au and Sn as the main components, alloys containing Au and Si as the main components, alloys containing Au and Ge as the main components, etc., or alternatively, an electrically conductive paste or bump such as of silver, gold, palladium, etc., an anisotropic electrically conductive material such as ACP, ACF, etc., a brazing material of a low melting point metal, and an electrically conductive adhesive or electrically conductive composite adhesive using two or more of these in combination.

In the case of mounting in a face down manner, it is possible to directly connect the electrodes of the light emitting element to the wiring pattern of the substrate with these materials disposed between the electrodes of the light emitting element and the wiring pattern of the substrate.

Reflective Member 901

The light emitting element 70 is covered by the reflective member 901.

For the reflective member 901, for ease of covering, a resin containing a light reflective material is preferably used. For the light reflective material, it is possible to use titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, etc. The resin can be selected from a thermosetting resin, a thermoplastic resin, a modified resin of these, or a hybrid resin containing one or more of these resins, etc. In particular, in view of adhesiveness with the light-transmissive member 301, etc., it is preferable that the reflective member 901 include the same material as the materials of the light-transmissive member 301, particularly the same resin, and it is most preferable to be a silicone based material which is not easily degraded due to heat or light.

In the case where a plurality of the light emitting elements 70 are mounted on one substrate, in the case where a single light-transmissive member 301 is fixed on the plurality of light emitting elements 70, in the case where a plurality of light-transmissive members 301 are each fixed on a respective one of the plurality of light emitting elements 70, or the like, as necessary, the light-transmissive member 301, the reflective member 90 and/or the substrate or the like may be separated for each one light emitting element or for each group of light emitting elements, or may not be separated. This allows for obtaining the light emitting device with the intended orientation, luminance, size, etc. The separation in this case can be performed using blade dicing, laser dicing, etc.

EXAMPLES

Examples of the present invention will be described below. The present invention is not limited only to the examples described below.

Example 1

The light-transmissive sheet of Example 1 has a structure shown in FIG. 3.

Forming the First Resin on the First Support

As shown in the manufacturing method of FIG. 4B, europium activated β sialon and manganese activated potassium fluorosilicate were mixed with phenyl silicone to prepare the first resin 30. The prepared slurry was molded using a die coater into a shape with width 150 mm, length 150 mm and thickness 150 μm on the first support 10 of width 160 mm, length 160 mm, and thickness 60 μm.

Forming the Second Resin on the Second Support

As shown in the manufacturing method of FIG. 4E, the second resin 40 was prepared. The prepared slurry was formed using a die coater in a shape of width 150 mm, length 150 mm, and thickness 150 μm on the first support 10 of width 160 mm, length 160 mm and thickness 60 μm.

Processing to Convert to B-Stage

The first resin 30A having the first support 10 as the bottom surface, and the second resin 40A having the second support 20 as the bottom surface, these were placed on a stainless steel plate with a thickness of 2 mm, and placed generally horizontally together with this plate inside an oven, and the process of converting to the B-stage was performed by heating at 120° C. for 20 minutes;

Laminating the Second Support

The first support 10 for which the first resin 30B converted to the B-stage is placed on the top surface and the second support 20 for which the second resin 40B is placed on the top surface were laminated. The second resin 40B was mounted on the surface of the first resin 30B, this was placed in a vacuum laminator with the first support 10 as the bottom surface, and vacuum bonding was performed at the vacuum level during bonding of 10 hPa, bonding pressure of 0.2 MPa, and bonding duration of 20 seconds.

Converting to C-Stage

Figure 12:
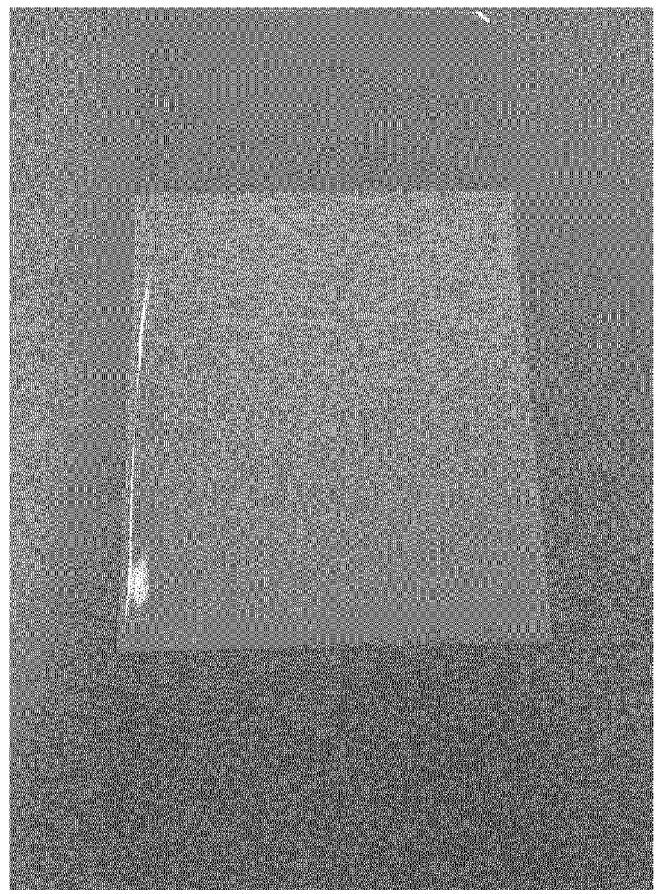
FIG. 12 is a photograph of the light-transmissive sheet of Example 1.
Figure 13:
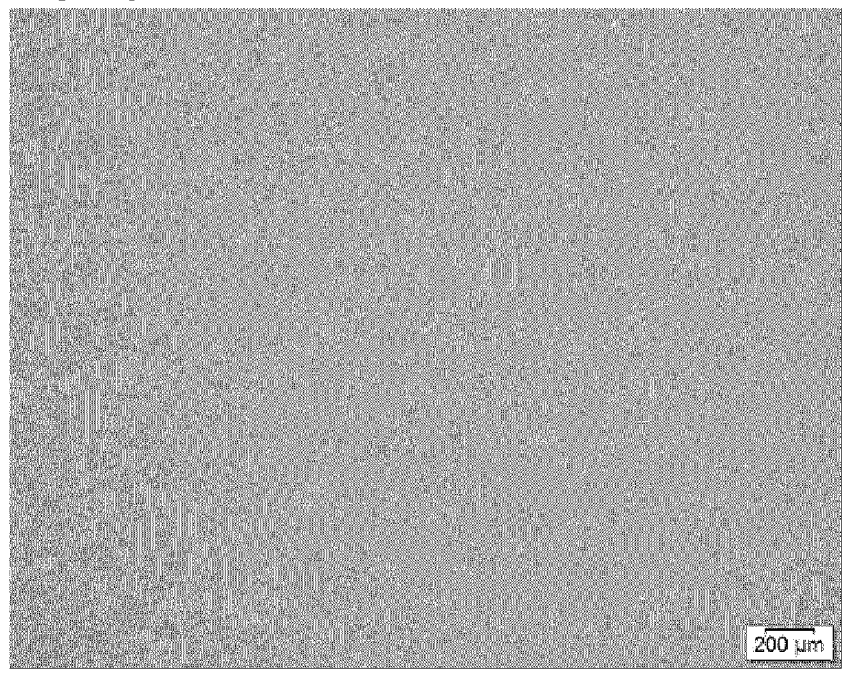
FIG. 13 is a photograph of the light-transmissive sheet of Example 1.

The first support 10, the first resin 30B, the second resin 40B, and the second support 20, which had been bonded together, were placed man oven at 30° C. in a layered state, and held at 150° C. for 6 hours. Then, cooling was performed, and the first support 10, the first resin 30B, the second resin 40B, and the second support 20 were taken out at 60° C., so that the light-transmissive sheet was obtained. The obtained light-transmissive sheet, as shown in FIG. 12, had a flat surface and a uniform thickness. Further, as shown in FIG. 13, a surface of the second resin from which the second support had been removed at one side of the light-transmissive sheet was very smooth, and the light-transmissive sheet was preferable to be used for a light emitting device, etc.

Comparison Example 1

Figure 14:
FIG. 14 is a photograph of the light-transmissive sheet of Comparative Example 1.

The light-transmissive sheet was produced using the same manufacturing method as Embodiment 1 other than not performing the step of processing to convert to the B-stage where heating is performed for 20 minutes at 120° C. The obtained light-transmissive sheet, as shown in FIG. 14, irregularities were generated as a whole, resulting in uneven thickness, and the degree of flatness was greatly reduced.

Comparison Example 2

Figure 15:
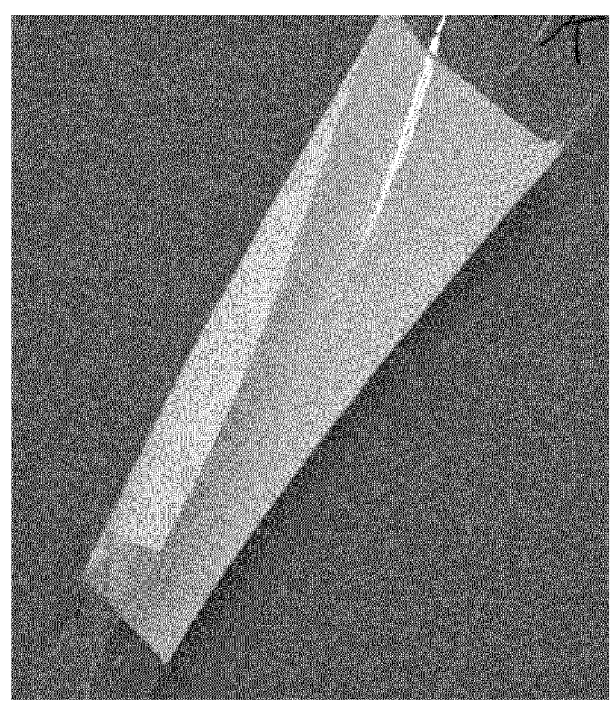
FIG. 15 is a photograph of the light-transmissive sheet of Comparative Example 2.
Figure 16:
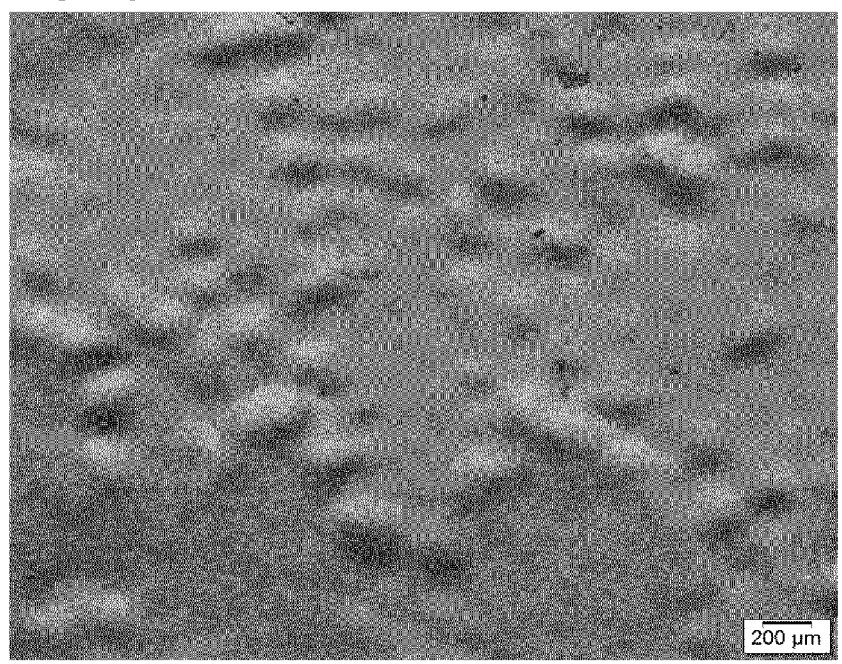
FIG. 16 is a photograph of the light-transmissive sheet of Comparative Example 2.

The light-transmissive sheet was produced using the same manufacturing method as Embodiment 1 other than not perforating the step of laminating the second support. The obtained light-transmissive sheet, as shown in FIG. 15, greatly curved as a whole, and the degree of flatness was greatly degraded. Also, as shown in FIG. 16, in a surface of the resin from which the second support at one side of the light-transmissive sheet had been removed many small irregularities were generated compared to the example, which caused variations in the thickness of the light-transmissive sheet.

What is claimed is:

1. A method of manufacturing a light-transmissive sheet comprising:
   preparing a first support film having a first resin member in a B-stage placed on a surface of the first support film, the first resin member containing a silicone resin or a modified resin of the silicone resin;
   preparing a second support film;
   laminating the first support film and the second support film in a vacuum using a vacuum laminator with the first resin member being continuously disposed in a region between the first support film and the second support film, and a thickness of the first resin member being substantially constant throughout the region between the first support film and the second support film; and
   heating the first resin member to convert the first resin member from the B-stage to a C-stage, in a state in which the second support film is placed on a surface of the first resin member, wherein
   the heating of the first resin member includes raising a temperature from a starting range of 20° C. to 60° C. when the first resin member is in the B-stage, and maintaining at a prescribed temperature in a range of 80° C. to 200° C. to covert the first resin member to the C-stage.

2. The method of manufacturing a light-transmissive sheet according to claim 1, wherein
   the preparing of the first support film includes
      providing the first support film having the first resin member in an A-stage placed on the surface of the first support film, and
      heating the first resin member to convert the first resin member from the A-stage to the B-stage.

3. The method of manufacturing a light-transmissive sheet according to claim 2, wherein
   the providing of the first support film having the first resin member in the A-stage includes coating a resin material in an A-stage on the surface of the first support film to form the first resin member in the A-stage.

4. The method of manufacturing a light-transmissive sheet according to claim 1, wherein
   the first resin member contains phosphor.

5. The method of manufacturing a light-transmissive sheet according to claim 1, wherein
   the first resin member includes at least a first resin layer and a second resin layer.

6. The method of manufacturing a light-transmissive sheet according to claim 5, wherein
   at least one of the first resin layer and the second resin layer contains phosphor.

7. A method of manufacturing a light-transmissive sheet comprising:
   preparing a first support film having a first resin member in a B-stage placed on a surface of the first support film, the first resin member containing a silicone resin or a modified resin of the silicone resin;
   preparing a second support film on which a second resin member in the B-stage is placed;
   laminating the first support film and the second support film in a vacuum using a vacuum laminator with the first resin member and the second resin member being continuously disposed in a region between the first support film and the second support film, and a total thickness of the first resin member and the second resin member being substantially constant throughout the region between the first support film and the second support film; and
   heating the first resin member to convert the first resin member and the second resin member from the B-stage to a C-stage, in a state in which the second resin member is placed on a surface of the first resin member.

8. The method of manufacturing a light-transmissive sheet according to claim 7, wherein
   the second resin member contains phosphor.

9. The method of manufacturing a light-transmissive sheet according to claim 7, wherein the second resin member has a plurality of laminated resin layers.

10. The method of manufacturing a light-transmissive sheet according to claim 1, wherein
the heating of the first resin member includes heating the first resin member in a state in which the first support film is placed on a substantially flat surface of a plate member while the substantially flat surface of the plate member is maintained generally horizontally.

11. The method of manufacturing a light-transmissive sheet according to claim 7, wherein
the laminating of the first support film and the second support film includes placing the second support film on the surface of the first resin member so that a surface of the second resin member contacts the surface of the first resin member.

12. A method of manufacturing a light emitting device comprising:
preparing the light-transmissive sheet using the method of manufacturing a light-transmissive sheet according to claim 1;
removing the first support film and the second support film from the light-transmissive sheet to obtain a light transmissive member;
preparing a light emitting element having a main light emitting surface and an electrode forming surface opposite to the main light emitting surface;
placing the light transmissive member on the main light emitting surface of the light emitting element; and
covering a lateral surface of the light emitting element with a reflective member.

13. The method of manufacturing a light-transmissive sheet according to claim 1, further comprising
removing the first support film and the second support film after the first resin member is converted to the C-stage.

14. The method of manufacturing a light-transmissive sheet according to claim 1, wherein
the preparing of the first support film includes
providing the first support film having the first resin member in an A-stage placed on the surface of the first support film, and
heating the first resin member at a temperature in a range of 80° C. to 150° C. to convert the first resin member from the A-stage to the B-stage.

15. The method of manufacturing a light-transmissive sheet according to claim 1,
the second support film is made of the same material as the first support film.

16. The method of manufacturing a light-transmissive sheet according to claim 7, further comprising
removing the first support film and the second support film after the first resin member and the second resin member are converted to the C-stage.

17. The method of manufacturing a light-transmissive sheet according to claim 7, wherein
the preparing of the first support film includes forming the first resin member including a plurality of laminated resin layers in the B-stage on the surface of the first support film.

18. The method of manufacturing a light emitting device according to claim 12, wherein
the preparing of the light-transmissive sheet incudes preparing the light-transmissive sheet having a light transmittance of 60% or greater with respect to peek wavelength of light emitted from the light emitting element.

* * * * *